(12) United States Patent
Fartash

(10) Patent No.: US 6,955,835 B2
(45) Date of Patent: Oct. 18, 2005

(54) METHOD FOR FORMING COMPRESSIVE ALPHA-TANTALUM ON SUBSTRATES AND DEVICES INCLUDING THE SAME

(75) Inventor: Arjang Fartash, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 48 days.

(21) Appl. No.: 10/426,564

(22) Filed: Apr. 30, 2003

(65) Prior Publication Data

US 2005/0170105 A1    Aug. 4, 2005

(51) Int. Cl.[7] .............................................. C23C 16/00
(52) U.S. Cl. ................... 427/250; 427/255.7; 427/596; 204/192.1
(58) Field of Search ............................ 427/250, 255.7, 427/596; 204/192.1

(56) References Cited

U.S. PATENT DOCUMENTS

| | | | |
|---|---|---|---|
| 3,878,079 A | 4/1975 | Schauer | |
| 4,719,477 A | 1/1988 | Hess | |
| 5,221,449 A | 6/1993 | Colgan et al. | |
| 5,317,346 A | 5/1994 | Garcia | |
| 5,518,936 A * | 5/1996 | Yamamoto et al. | 148/241 |
| 6,139,699 A | 10/2000 | Chiang et al. | |
| 6,162,589 A | 12/2000 | Chen et al. | |
| 6,209,991 B1 | 4/2001 | Regan et al. | |
| 6,286,939 B1 | 9/2001 | Hindman et al. | |
| 6,369,491 B1 * | 4/2002 | Nakagawa et al. | 310/364 |
| 6,387,719 B1 | 5/2002 | Mrvos et al. | |
| 6,395,148 B1 * | 5/2002 | Whitman | 204/192.15 |
| 6,451,181 B1 | 9/2002 | Denning et al. | |
| 6,458,255 B2 | 10/2002 | Chiang et al. | |
| 6,488,823 B1 | 12/2002 | Chiang et al. | |
| 2001/0014000 A1 | 8/2001 | Tanaka et al. | |
| 2002/0070375 A1 | 6/2002 | Chiang et al. | |

FOREIGN PATENT DOCUMENTS

| | | |
|---|---|---|
| WO | WO 01/64443 | 7/2001 |
| WO | PCT/US2004/013531 | 4/2004 |
| WO | WO04/096555 | 11/2004 |

OTHER PUBLICATIONS

Hilke Donohue, et al. "Low-resistivity PVD a-tantalum: Phase formation and integration in ultra-low K dielectric/copper damascene structures".
D. Fischer, et al.; "Barrier and Contact Behavior of Tantalum Based Thin Films for Use in Copper Metallization Scheme".
Rogojevic et al., Interactions Between Silica Xerogel And Tantalum,J. Vac. Sci. Technol. B 19(2), Mar./Apr. 2001, pp. 354-360, 2001 American Vacuum Society.

(Continued)

Primary Examiner—Timothy Meeks
Assistant Examiner—David Turocy

(57) ABSTRACT

A layer of compressive alpha-tantalum is formed on a substrate by depositing a buffer layer on the substrate and depositing a layer of compressive alpha-tantalum on the buffer layer with lattice matching between the layer of compressive alpha-tantalum and the buffer layer. In some embodiments, the method may include depositing buffers layers comprising titanium, niobium, substantially pure aluminum or aluminum-copper alloy.

21 Claims, 7 Drawing Sheets

OTHER PUBLICATIONS

Morohashi et al., Fabrication of a Tantalum-Based Josephson Junction for an X-Ray Detector, Jpn. J. Appl. Phys. vol. 39 (2000) pp. 3371-3377, Part 1, No. 6A, Jun. 2000.

Chen et al., Growth Mechanism of Sputter Deposited Ta and Ta-N Thin Films Induced by an Underlying Titanium Layer and Varying Nitrogen Flow Rates, Applied Surface Science 169-170 (2001) pp. 353-357.

Hoogeveen et al., Texture and Phase Transformation of Sputter-Deposited Metastable Ta Films and Ta/Cu Multilayers, Thin Solid Films 275 (1996) pp 203-206.

Clevenger et al., The Relationship Between Deposition Conditions, The Beta to Alpha Phase Transformation, and Stress Relaxation in Tantalum Thin Films, J. Appl. Phys. 72 (10), Nov. 15, 1992.

* cited by examiner

METHOD FOR FORMING COMPRESSIVE ALPHA-TANTALUM ON SUBSTRATES AND DEVICES INCLUDING THE SAME

CROSS-REFERENCE TO RELATED APPLICATIONS

This patent application is related to a copending and simultaneously filed utility patent application Ser. No. 10/426,561 titled "FLUID EJECTION DEVICE WITH COMPRESSIVE ALPHA-TANTALUM LAYER," filed Apr. 29, 2003.

BACKGROUND OF THE INVENTION

Tantalum (Ta) thin films are widely used in manufacturing of semiconductor and micro-electromechanical systems (MEMS). For example, in semiconductor integrated circuit manufacturing, tantalum may be used as a diffusion barrier between copper and silicon. Tantalum may also be used as a gate electrode in metal oxide semiconductor field effect transistor (MOSFET) devices. Tantalum may also be used to absorb X-rays in X-ray masks. In thermal inkjet MEMS such as a printhead, tantalum is used as a protective overcoat on the resistor and other substrate layers to protect the underlying layers from damage caused by cavitation from the collapsing ink bubbles. The tantalum layer also protects the underlying layers of a printhead from chemical reactions with the ink.

The metastable tetragonal phase of tantalum, known as the beta-phase or "beta-tantalum" is typically used in the manufacture of thermal inkjet devices. This beta-tantalum layer is brittle and becomes unstable as temperatures increase. Above 300° C., beta-tantalum converts to the body-centered-cubic (bcc) alpha-phase or "alpha-tantalum." Alpha-tantalum is the bulk equilibrium or stable-phase of tantalum. It is desired to form stable, compressive alpha-tantalum films and such films on fluid ejection devices. Such compressive alpha-tantalum films may increase the useful life of such devices by resistance to peeling, blistering or delamination from the substrate.

SUMMARY OF THE INVENTION

A layer of compressive alpha-tantalum is formed on a substrate by depositing a buffer layer on the substrate and depositing a layer of compressive alpha-tantalum on the buffer layer with lattice matching between the layer of compressive alpha-tantalum and the buffer layer. In some embodiments, the method may include depositing buffers layers comprising titanium, niobium, substantially pure aluminum or aluminum-copper alloy.

BRIEF DESCRIPTION OF THE DRAWINGS

The following drawings illustrate exemplary embodiments for carrying out the invention. Like reference numerals refer to like parts in different views or embodiments of the drawings.

DETAILED DESCRIPTION

Figure 1:
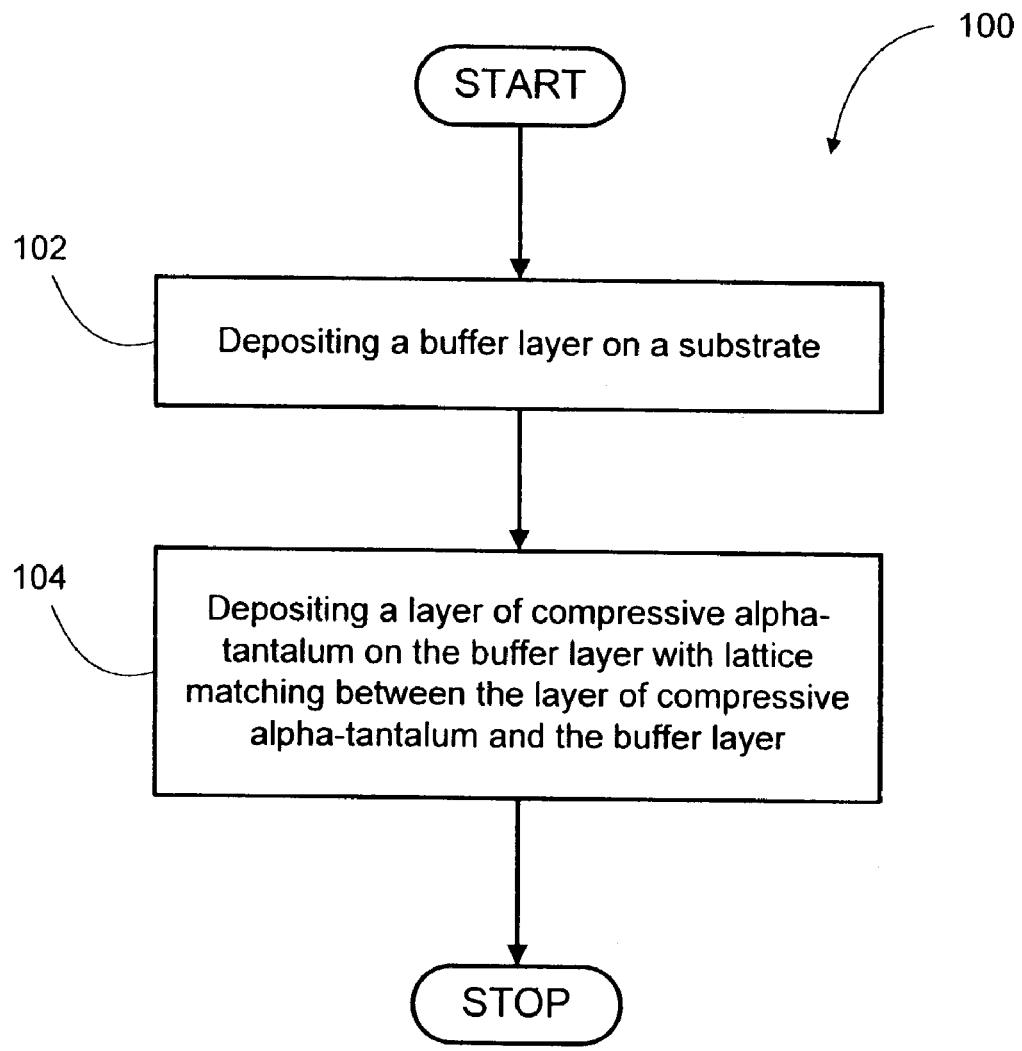
FIG. 1 is a flow chart of a method of forming a layer of compressive alpha-tantalum on a substrate according to an embodiment of the present invention.

Embodiments of the invention include a method of forming a layer of compressive alpha-tantalum on a substrate. Compressive alpha-tantalum thin films, fluid ejection devices, thermal inkjet printheads and thermal inkjet printers are also disclosed. Reference will now be made to exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

A thermal inkjet (TIJ) printhead typically includes a silicon substrate having conductive and resistive layers thereon to provide electrical features that are used to heat and eject ink from the printhead. The resistive layers are used to heat ink until it vaporizes, creating a bubble. The expansion of the ink vapor forms a bubble that ejects the ink out from the printhead as an ink drop onto a target, typically paper, as a single dot or pixel. The term "firing" as used herein contemplates the whole process of heating of the ink and ejecting the ink as an ink drop and the collapse of the ink vapor bubble.

Problems associated with conventional TIJ printheads include failures resulting from high thermo-mechanical stresses caused during and after the firing of the ink drop, mechanical shock generated by the collapse of the ink bubble (cavitation) and the corrosive nature of the ink. For these reasons, protective layers are typically placed over the resistor and other layers forming the printhead to prolong the life of the printhead.

Resistive elements (sometimes referred to herein as heating elements) on a printhead substrate are typically covered with a passivation layer, e.g., silicon nitride (SiN), and/or silicon carbide (SiC) and a cavitation barrier layer, e.g., tantalum. Silicon nitride is ceramic material and an electrical insulator that protects the resistor from electrically shorting. Silicon carbide is a hard semiconductor material and structurally amorphous. Silicon carbide is used to prevent ink from permeating through and reaching the underlying layers of a printhead and to provide mechanical robustness. Tantalum has good mechanical strength to withstand the thermo-mechanical stresses that result from the ejection of the ink. Additionally, tantalum has chemical inertness at elevated temperatures that minimizes corrosion caused by ink.

The tantalum layer is often composed of the metastable tetragonal phase of tantalum, known as the beta-phase or "beta-tantalum." This beta-tantalum layer is brittle and becomes unstable as temperatures increase.

FIG. 1 is a flow chart of a method 100 of forming a layer of compressive alpha-tantalum on a substrate according to embodiments of the present invention. The substrate may be formed of a semiconductor material. The substrate may include other layers of materials including silicon nitride (SiN) and/or a layer of silicon carbide (SiC). The silicon carbide layer may be on the surface of the substrate. Method 100 may include depositing 102 a buffer layer on the substrate and depositing 104 a layer of compressive alpha-tantalum on the buffer layer with lattice matching between the layer of compressive alpha-tantalum and the buffer layer. The layer of compressive alpha-tantalum may have thickness ranging from about 10 Angstroms (A) to about 4 micrometers ($\mu$m).

The term "lattice matching" refers to when lattice points of crystal planes of materials forming a common interface approximately match each other geometrically across their interface. For two distinct crystal planes to match geometrically across their interface the symmetries of these planes are substantially identical and their lattice mismatches within less than about 5% of each other. Lattice matching is also defined in *Strained Layer Superlattices, Semiconductors and Semimetals*, Vol. 33, edited by R. K. Willardson and A. C. Beer (Academic, New York, 1990) and also in J. A. Venables, G. Spiller, and M. Hanbucken, Rep. Prog. Phys. 47, 399 (1984) and references cited therein.

Depositing 102 the buffer layer and depositing 104 the compressive alpha-tantalum may be performed using any suitable physical vapor deposition technique. For example, and not by way of limitation, sputtering, laser ablation, e-beam and thermal evaporation techniques, individually or in combination, may be used in depositing 102 and 104. Depositing 102 and 104 may be performed at any temperature including substrate temperatures less than 300° C. Furthermore, depositing 102 the buffer layer may further include application of a substrate voltage bias. The voltage bias may range from about 0 volts to about −500 volts, using a conventional DC magnetron sputtering process.

Depositing 102 a buffer layer may include depositing a layer of titanium. The layer of titanium may have a thickness from about 3 monolayers to about 2000 Å according to embodiments of the present invention. Presently preferred thicknesses for titanium buffer layers may range from at least about 400 Å according to other embodiments of the present invention. For atomically smooth substrate surfaces, the layer of titanium is contemplated to be as thin as a single monolayer in accordance with embodiments of the present invention. In one embodiment, the layer of titanium may orient on the substrate with titanium crystal [100] direction perpendicular to the substrate. According to another embodiment, lattice matching may occur between the layer of titanium and the layer of compressive alpha-tantalum.

Depositing 102 a buffer layer may include depositing a layer of niobium. The layer of niobium may have a thickness from about 3 monolayers to about 2000 Å consistent with embodiments of the present invention. For atomically smooth substrate surfaces, the layer of niobium is contemplated to be as thin as a single monolayer in accordance with embodiments of the present invention. Presently preferred thicknesses for niobium buffer layers may range from at least about 200 Å according to other embodiments of the present invention.

In another embodiment, depositing 102 a buffer layer may include depositing a layer of substantially pure aluminum or aluminum-copper alloy. The layer of aluminum-copper alloy may include up to about 10% by weight of copper. The layer of substantially pure aluminum or aluminum-copper alloy may have a thickness from about 3 monolayers to about 2000 Å consistent with embodiments of the present invention. For atomically smooth substrate surfaces, the layer of substantially pure aluminum or aluminum-copper alloy is contemplated to be as thin as a single monolayer in accordance with embodiments of the present invention.

Figure 2:
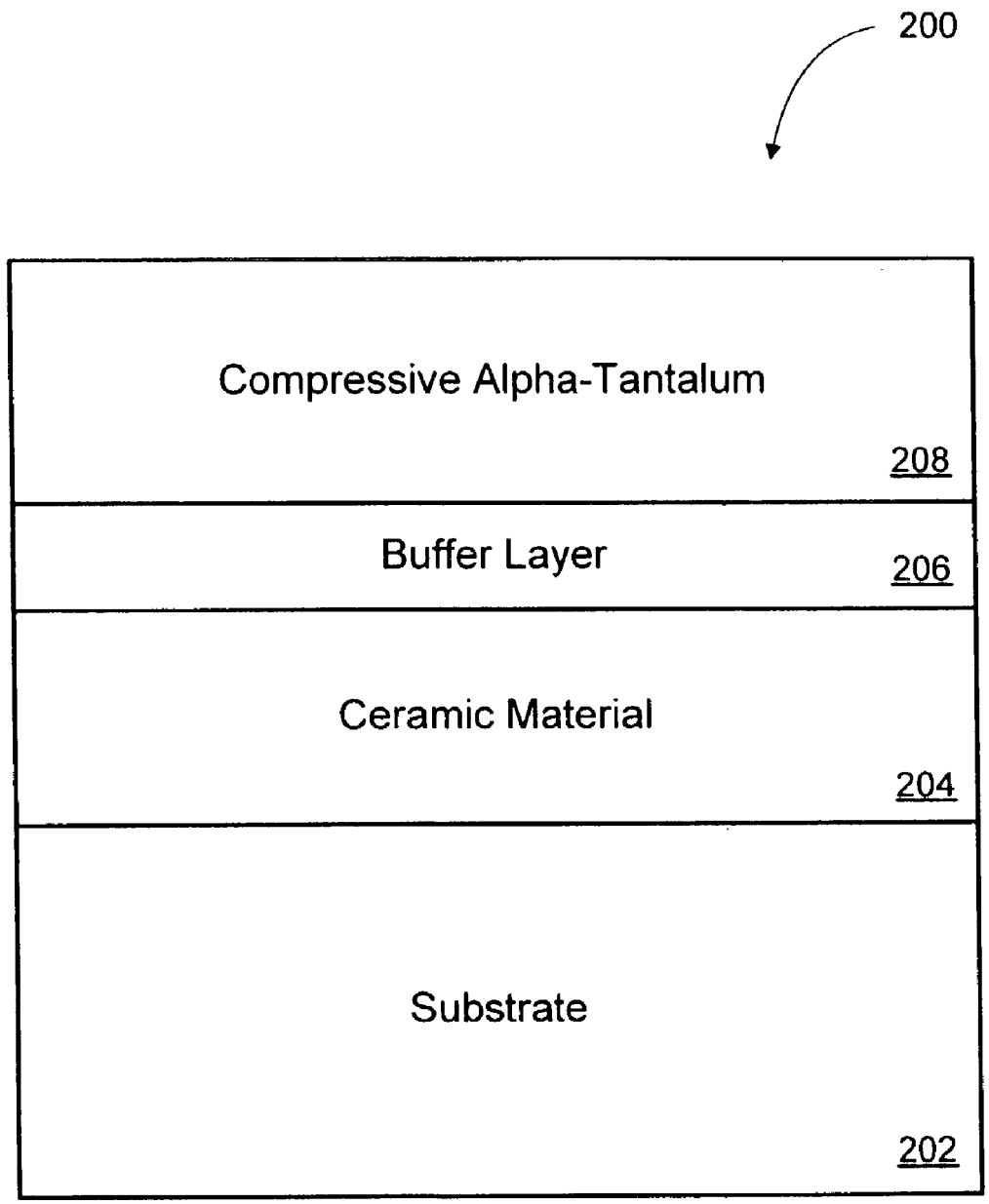
FIG. 2 is a cross-sectional graphical representation of a compressive alpha-tantalum thin film according to an embodiment of the present invention.

FIG. 2 is a cross-sectional graphical representation of a compressive alpha-tantalum thin film stack 200 according to embodiments of the present invention. The compressive alpha-tantalum thin film stack 200 may include a ceramic material 204 in contact with a substrate 202, a buffer layer 206 in contact with the ceramic material 204 and a compressive alpha-tantalum layer 208 lattice matched to the buffer layer 206. The ceramic material 204 may include silicon carbide (SiC). The buffer layer may include at least one of titanium, niobium, substantially pure aluminum and aluminum-copper alloy.

Figure 3:
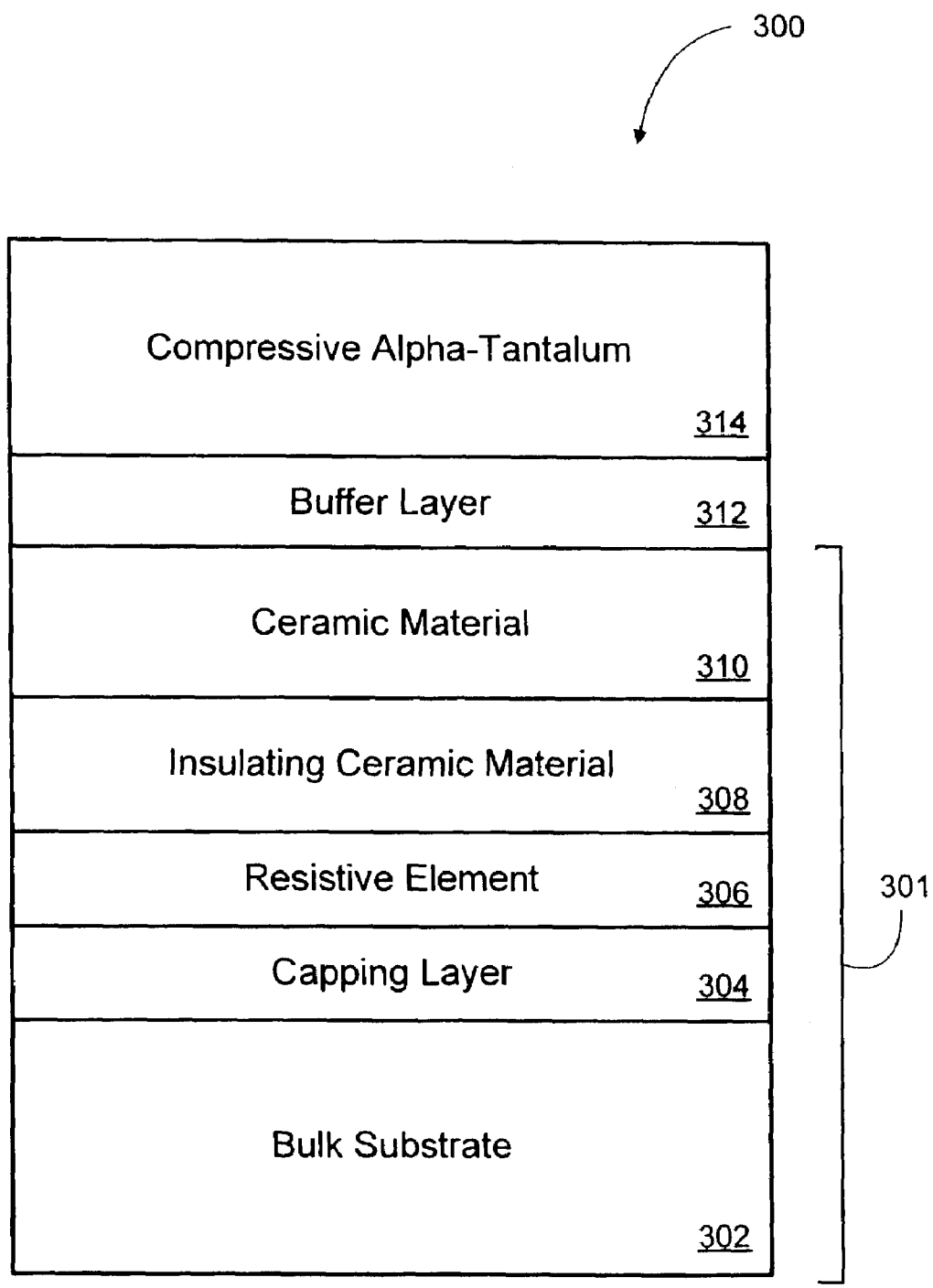
FIG. 3 is a cross-sectional graphical representation of a fluid ejection device including compressive alpha-tantalum according to an embodiment of the present invention.

FIG. 3 is a cross-sectional graphical representation of a fluid ejection device 300 including compressive alpha-tantalum according to embodiments of the present invention. The fluid ejection device 300 may comprise a thermal inkjet printhead or thermal inkjet printer consistent with embodiments of the present invention. The fluid ejection device 300 may include a substrate stack 301. The substrate stack 301 may include a resistive element 306, bulk substrate 302, an optional capping layer 304, an insulating ceramic material 308 and a ceramic material 310. The fluid ejection device 300 may further include a buffer layer 312 formed on the second ceramic material 310 and a compressive alpha-tantalum layer 314 lattice matched to the buffer layer 312.

The capping layer 304 may include, for example and not by way of limitation, a thermal oxide, silicon dioxide ($SiO_2$), or tetraethylorthosilicate (TEOS) layer. The buffer layer 312 is in contact with second ceramic material 310. Likewise, buffer layer 312 is in contact with the compressive alpha-tantalum 314. The insulating ceramic material 308 may include silicon nitride (SiN). Second ceramic material 310 may include silicon carbide (SiC). The buffer layer 312 may be formed on second ceramic material 310 by at least one of the following physical vapor deposition techniques: sputtering, laser ablation, e-beam and thermal evaporation. The layer of compressive alpha-tantalum 314 may have a thickness ranging from about 10 Å to about 4 $\mu$m. In accordance with embodiments of the present invention, the buffer layer 312 may be formed of any material that forces tantalum to grow in a compressive state as alpha-tantalum, through, for example, lattice matching. In some embodiments, the buffer layer is at least one of titanium, niobium, substantially pure aluminum and aluminum-copper alloy as further explained below with reference to the examples.

EXAMPLE 1

Titanium Buffer Layer

In this embodiment, the buffer layer 312 may be formed of a layer of titanium. The layer of titanium may have a thickness ranging from about 3 monolayers to about 2000 Å according to embodiments of the present invention. As mentioned above, presently preferred thicknesses for titanium buffer layers may range from at least about 400 Å according to other embodiments of the present invention.

The crystal structure of titanium is hexagonal closed packed (hcp). In one embodiment of the present invention, the layer of titanium may orient on a substrate stack 301 with the titanium crystal [100] direction perpendicular to the substrate stack 301. In another embodiment, the layer of titanium may include textured titanium grains.

The tantalum overlayer orients in Ta[110] direction perpendicular to the substrate with compressive residual stress. Lattice matching across the Ti/Ta interface forces the tantalum overlayer to grow in the body centered cubic (bcc) alpha-tantalum phase.

Table 1, below, shows parameters taken from five study wafers 1–5 with titanium buffer layers and compressive alpha-tantalum overlayers in accordance with the method of embodiments of the present invention. Each wafer included a bulk silicon substrate with passivation layers of silicon nitride and silicon carbide. For each wafer, the buffer layer of titanium was first sputter deposited onto the silicon carbide surface followed by sputtering of the compressive alpha-tantalum layer. Columns 2–3 of Table 1 show tantalum/titanium (Ta/Ti) layer thicknesses measured in Å and alpha-tantalum film stress measured in Mega-Pascals (MPa). Columns 4–5 show deposition parameters for each tantalum layer, i.e., argon flow rate measured in SCCM (flow of Standard gas at a pressure of one atmosphere at a rate of one Cubic Centimeter per Minute) and argon pressure measured in millitorrs (mTorr), respectively. Column 6 shows plasma power applied during sputter deposition measured in kilo-Watts (kW). Plasma power was reduced from 3 kW to 1.5 kW for thinner layers of titanium to increase the precision in thickness control. The titanium layers were grown at an argon pressure of 2.5 mTorr and an argon flow rate of 100 SCCM. Of course, one skilled in the art will recognize that the plasma power ranges, argon pressure and flow rate stated above for these particular embodiments are merely exemplary and that other ranges and settings for these parameters are also within the scope of the present invention.

TABLE 1

| Wafer No. | Ta/Ti Layer Thicknesses (in units of Å) | Alpha-Tantalum Film Stress (in units of MPa) | Argon Flow Rate (in units of SCCM) | Argon Pressure (in units of mTorr) | Plasma Power (in units of kW) |
|---|---|---|---|---|---|
| 1 | 3000/100 | −651.4 | 100 | 5 | 10 (Ta)/ 1.5 (Ti) |
| 2 | 3000/200 | −747.1 | 100 | 5 | 10 (Ta)/ 1.5 (Ti) |
| 3 | 3000/400 | −744.8 | 100 | 5 | 10 (Ta)/ 3 (Ti) |
| 4 | 3000/600 | −730.4 | 100 | 5 | 10 (Ta)/ 3 (Ti) |
| 5 | 3000/800 | −706.8 | 100 | 5 | 10 (Ta)/ 3 (Ti) |

Another aspect of embodiments of the present invention including titanium buffer layers is the internal or residual stresses in the resultant alpha-tantalum thin film. The underlying substrate layers, such as silicon nitride (SiN) and silicon carbide (SiC) are under compressive stresses. For this additional reason, the alpha-tantalum overlayer is grown in compression to substantially avoid blistering and delamination.

In this embodiment, the alpha-tantalum films of Table 1 were grown under compressive stress. No voltage biasing was applied to the substrate during deposition. However, in some embodiments, applying a substrate voltage bias would make the alpha-tantalum thin films even more compressive if desired. The tantalum and titanium layers were deposited using DC magnetron sputtering according to embodiments of the present invention. However, other physical vapor deposition techniques may be used consistent with other embodiments of the present invention, for example and not by way of limitation, laser ablation, e-beam and thermal evaporation.

The strength of adhesion of the Ta/Ti bilayer to the silicon carbide passivation layer was tested using a Scotch™ tape method. The Scotch™ tape was used to attempt to peel off the Ta/Ti bilayer from the silicon carbide passivation layer. The Ta/Ti bilayer failed to peel off. In one embodiment, the strong adhesion between Ta/Ti bilayer and the silicon carbide passivation layer may result from the formation of titanium carbide (TiC) covalent bonds across the SiC/Ti interface that provides strong bonding between the SiC/Ti interface layers. Furthermore, the bonds between the compressive alpha-tantalum topcoat and its titanium buffer layer are metallic.

Figure 4:
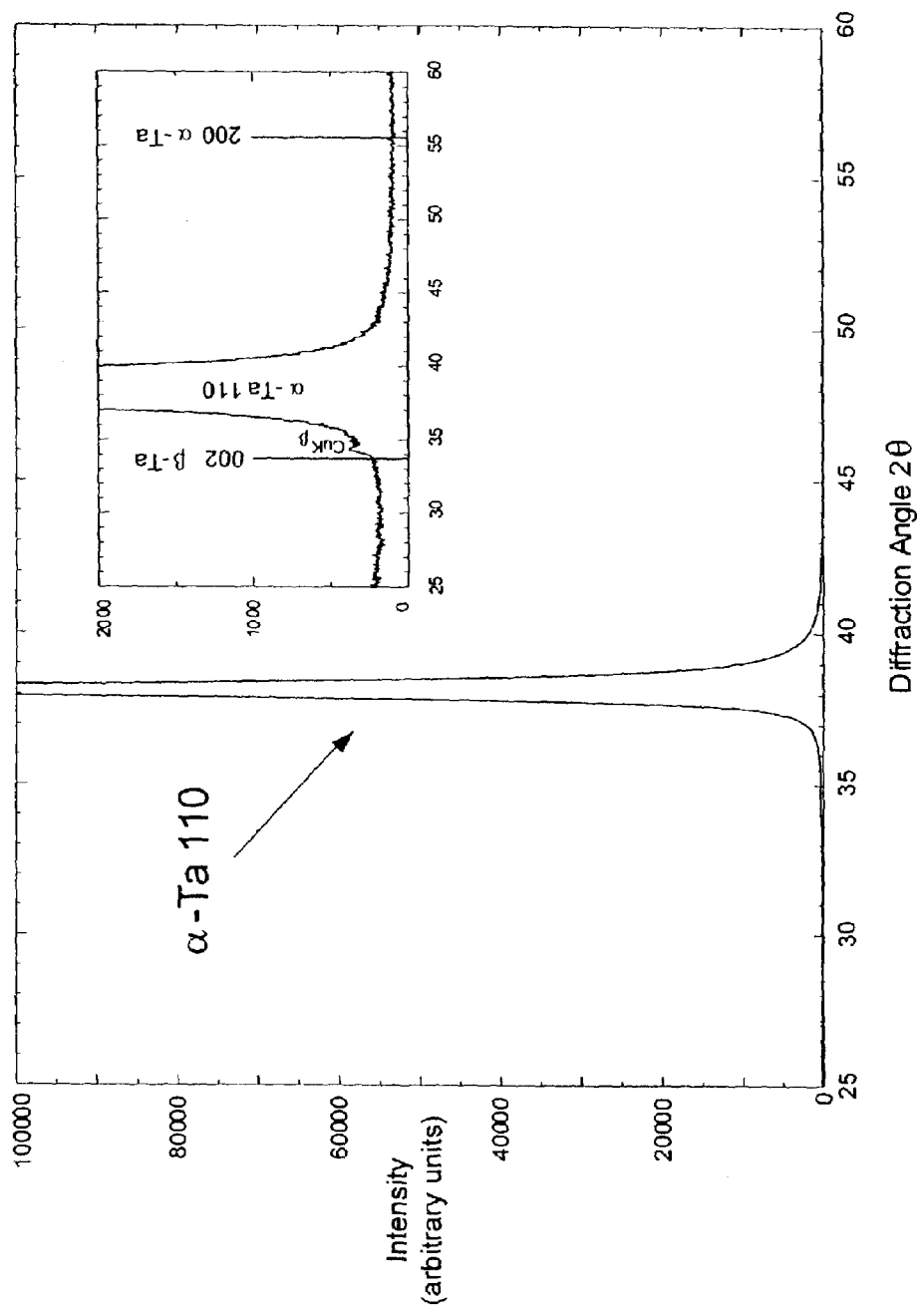
FIG. 4 is a graph of X-ray diffraction data corresponding to a compressive alpha-tantalum film with titanium buffer layer grown according to an embodiment of the present invention.

FIG. 4 is a graph of X-ray diffraction data corresponding to a compressive alpha-tantalum film with titanium buffer layer grown on study wafer number 2 according to method 100 of the embodiments of the present invention. In FIG. 4, the x-axis is diffraction angle measured in angular degrees and the y-axis is intensity measured in arbitrary units. The compressive alpha-tantalum was deposited on a 200 Å thick layer of titanium. The peak corresponds to [110] oriented alpha-tantalum. The inset graph shows vertical lines drawn to indicate the expected peak positions for beta-Ta(002) and alpha-Ta(200) reflections. Both of these expected reflections are absent, indicating a well-oriented alpha-Ta(110) layer grown on study wafer number 2. Since the peaks for alpha-Ta(110) and its Ti(100) buffer layer overlap, the reflection peak for titanium is masked and, thus, does not appear in FIG. 4. Additionally, the number of diffraction lines in the x-ray scans shown in FIG. 4 reveal [110] oriented single-phase alpha-tantalum overlayer, slight asymmetry apparent in the diffraction peaks may be attributed to an unreacted [001]-textured titanium buffer layer.

Table 2, below, shows X-ray diffraction data for the study wafers 1–5 of Table 1. Columns 2–6 show tantalum/titanium layer thicknesses in units of Å, tantalum phase, alpha-tantalum lattice spacing in units of Å, tantalum grain size in units of Å and alpha-tantalum rocking curve as measured in angular degrees at Full Width of the peak at Half Maximum peak height (FWHM). The width of the rocking curve provides a measure of the orientational distribution of alpha-tantalum columnar grains in angular degrees. The tantalum grain size and rocking curve data indicate that the titanium buffer layers with thicknesses 200 Å, 400 Å and 600 Å provide the desirable, larger tantalum grain size, i.e., approximately 130 angstroms, with narrower grain orientation distribution.

TABLE 2

| Wafer No. | Ta/Ti Layer Thicknesses (in units of Å) | Tantalum Phase | Alpha-Tantalum Lattice Spacing in units of Å | Tantalum Grain Size (in units of Å) | Alpha-Tantalum Rocking Curve (in units of ° FWHM) |
|---|---|---|---|---|---|
| 1 | 3000/100 | alpha | 3.340 ± 0.001 | ~100 | 5.4 |
| 2 | 3000/200 | alpha | 3.343 ± 0.001 | ~130 | 3.8 |

TABLE 2-continued

| Wafer No. | Ta/Ti Layer Thicknesses (in units of Å) | Tantalum Phase | Alpha-Tantalum Lattice Spacing in units of Å) | Tantalum Grain Size (in units of Å) | Alpha-Tantalum Rocking Curve (in units of° FWHM) |
| --- | --- | --- | --- | --- | --- |
| 3 | 3000/400 | alpha | 3.343 ± 0.001 | ~130 | 3.9 |
| 4 | 3000/600 | alpha | 3.341 ± 0.001 | ~130 | 3.8 |
| 5 | 3000/800 | alpha | 3.340 ± 0.001 | ~120 | 4.1 |

EXAMPLE 2

Niobium Buffer Layer

In this embodiment, the buffer layer 312 may be formed of a layer of niobium. The layer of niobium may have a thickness ranging from about 3 monolayers to about 2000 Å. As mentioned above, presently preferred thicknesses for niobium buffer layers may range from at least about 200 Å according to other embodiments of the present invention. Niobium and tantalum are members of the same column of the periodic table of elements and have similar physical properties. The crystal structure of niobium is bcc, which is the same as alpha-tantalum. The tantalum (110) overlayer almost perfectly lattice matches on the Nb(110) plane since the lattice spacings of the alpha-tantalum and niobium are almost identical, i.e., 3.3026 Å and 3.3007 Å, respectively. Unlike tantalum however, niobium does not grow in the beta-phase structure. Niobium always grows in the alpha-phase structure irrespective of the presence of impurity gases on the substrate or the substrate material type. Because of this property, if a thin layer of niobium is first deposited on a substrate stack 301, the tantalum overlayer is forced to grow in the alpha-tantalum phase because of lattice matching across the tantalum/niobium interface.

Table 3, below, shows parameters taken from six study wafers 6–11 with niobium buffer layers and compressive alpha-tantalum overlayers in accordance with the embodiments of the present invention. Each wafer included a bulk silicon substrate with passivation layers of silicon nitride and silicon carbide. For each wafer, the buffer layer of niobium was first sputter deposited onto the silicon carbide surface followed by sputtering of the compressive alpha-tantalum layer. The niobium layer thickness for the study wafers varied from 25 to 800 Å. Columns 2–3 of Table 3 show Ta/Nb layer thicknesses measured in Å and alpha-tantalum film stress measured in MPa. Columns 4–5 show deposition parameters for the tantalum layer, i.e., argon flow rate measured in SCCM, argon pressure measured in mTorr, respectively. Column 6 shows plasma power during sputter deposition measured in kW for tantalum and niobium layers, respectively. According to another embodiment of the present invention, thinner layers of niobium may be obtained by reducing the plasma power to about 0.5 kW, thus, allowing greater precision in thickness control. According an embodiment of the present invention, the niobium buffer layers were grown at an argon pressure of 2.5 mTorr and an argon flow rate of 100 SCCM. Of course, one skilled in the art will recognize that the above-stated plasma power ranges, argon pressure and flow rate for these particular embodiments are merely exemplary and that other ranges and settings for these parameters are also within the scope of the present invention.

TABLE 3

| Wafer No. | Ta/Nb Layer Thicknesses (in units of Å) | Alpha-Tantalum Film Stress (in units of MPa) | Argon Flow Rate (in units of SCCM) | Argon Pressure (in units of mTorr) | Plasma Power (in units of kW) |
| --- | --- | --- | --- | --- | --- |
| 6 | 3000/25 | −1529.9 | 100 | 5 | 10 (Ta)/ 1 (Nb) |
| 7 | 3000/50 | −1477.5 | 100 | 5 | 10 (Ta)/ 1 (Nb) |
| 8 | 3000/100 | −1477.9 | 100 | 5 | 10 (Ta)/ 1 (Nb) |
| 9 | 3000/200 | −1404.5 | 100 | 5 | 10 (Ta)/ 1 (Nb) |
| 10 | 3000/400 | −1267.8 | 100 | 5 | 10 (Ta)/ 1 (Nb) |
| 11 | 3000/800 | −1024.8 | 100 | 5 | 10 (Ta)/ 1 (Nb) |

Another aspect of embodiments of the present invention including niobium buffer layers is the internal or residual stresses in the resultant alpha-tantalum thin film. The stress data shown in Table 3 indicates that the alpha-tantalum films were grown under compressive stress. Additionally, the alpha-tantalum film stresses show a dependence on the thickness of the niobium buffer layer. No voltage biasing was applied to the substrate during deposition. Applying a substrate voltage bias causes the alpha-tantalum thin films to be even more compressive according to other embodiments of the present invention. The tantalum and niobium layers were deposited using DC magnetron sputtering according to embodiments of the present invention. However, other physical vapor deposition techniques may be used consistent with other embodiments of the present invention, for example and not by way of limitation, laser ablation, e-beam and thermal evaporation.

The strength of adhesion of the Ta/Nb bilayer to the silicon carbide passivation layer was tested using a Scotch™ tape method. The Scotch™ tape was used to attempt to peel off the Ta/Nb bilayer from the silicon carbide passivation layer. The Ta/Nb bilayer failed to peel off. In one embodiment, the adhesion strength can be attributed to metallic bondings between tantalum and its niobium buffer layer. In another embodiment, alloying of niobium and silicon, forming NbSi covalent bonds across the SiC/Nb interface may ensure robust bonding of these layers together. See for example, M. Zhang et al., *Thin Solid Films*, Vol. 289, no. 1–2, pp. 180–83 and S. N. Song, et al., *Journal of Applied Physics*, Vol. 66, no. 11, pp. 5560–66.

Figure 5:
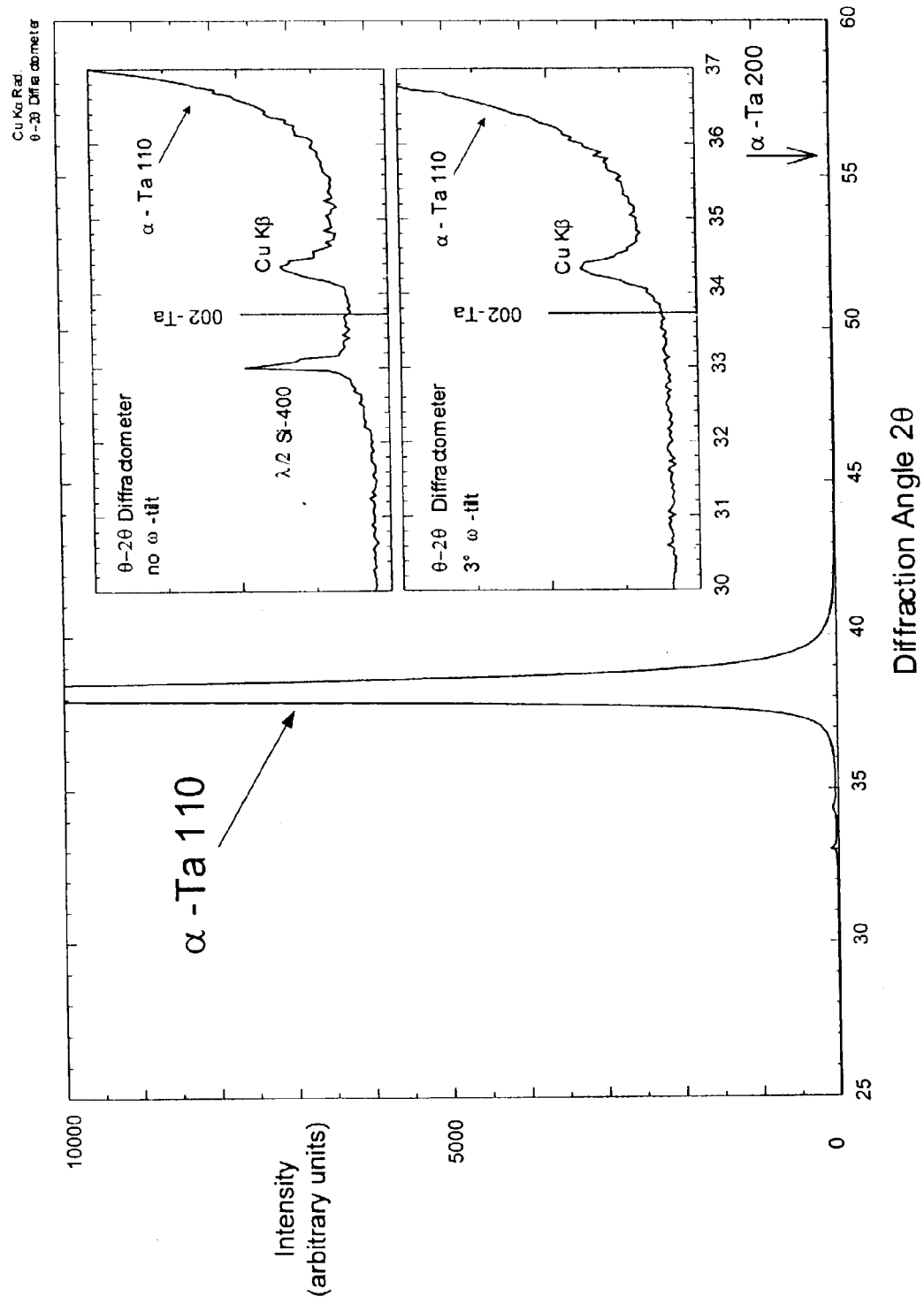
FIG. 5 is a graph of X-ray diffraction data corresponding to a compressive alpha-tantalum film with niobium buffer layer grown according to an embodiment of the present invention.

FIG. 5 is a graph of X-ray diffraction data corresponding to a compressive alpha-tantalum film with a niobium buffer layer grown on study wafer number 6 according to method 100 of the embodiments of the present invention. In FIG. 5, the x-axis is diffraction angle measured in angular degrees and the y-axis is intensity measured in arbitrary units. The compressive alpha-tantalum layer was deposited on a 25 Å thick layer of niobium. The peak corresponds to [110] oriented alpha-tantalum. The inset graphs show vertical lines drawn to indicate the expected peak position for beta-Ta(002) reflection. Additionally, the main graph shows an arrow indicating the expected peak position for an alpha-Ta(200) reflection. Both of these expected reflections are absent, indicating a well-oriented alpha-Ta(110) layer grown on study wafer number 6. In FIG. 5, the expected niobium reflection is masked because the peaks for alpha-Ta(110) and its Nb(110) buffer layer overlap.

Table 4, below, shows X-ray diffraction data for study wafers 6–11 of Table 1. Columns 2–6 show tantalum/niobium layer thicknesses in units of Å, tantalum phase, alpha-tantalum lattice spacing in units of Å, tantalum grain size in units of Å and alpha-tantalum rocking curve as measured in angular degrees at FWHM. The tantalum grain size and rocking curve data shown in Table 4 indicate that the 800 Å thickness niobium buffer layer provides a larger tantalum grain size with narrower grain orientation distribution with smaller internal stress relative to study wafers 6–10, see also Table 3.

TABLE 4

| Wafer No. | Ta/Nb Layer Thicknesses (in units of Å) | Tantalum Phase | Alpha-Tantalum Lattice Spacing in units of Å | Tantalum Grain Size (in units of Å) | Alpha-Tantalum Rocking Curve (in units of° FWHM) |
|---|---|---|---|---|---|
| 6 | 3000/25 | alpha | 3.337 ± 0.001 | ~160 | 4.3 ± 0.2 |
| 7 | 3000/50 | alpha | 3.336 ± 0.001 | ~160 | 4.4 ± 0.2 |
| 8 | 3000/100 | alpha | 3.336 ± 0.001 | ~170 | 4.3 ± 0.2 |
| 9 | 3000/200 | alpha | 3.336 ± 0.001 | ~175 | 4.3 ± 0.2 |
| 10 | 3000/400 | alpha | 3.335 ± 0.001 | ~180 | 4.3 ± 0.2 |
| 11 | 3000/800 | alpha | 3.334 ± 0.001 | ~190 | 4.0 ± 0.2 |

EXAMPLE 3

Substantially Pure Aluminum Buffer Layer

In this embodiment, the buffer layer 312 may be formed of a layer of substantially pure aluminum. The buffer layer may also be alloyed with copper, see Example 4, below. The crystal structure of aluminum is face centered cubic (fcc) and lattice matches on the Al(111) plane with the Ta(110) plane. Because of this property, if a thin layer of substantially pure aluminum is first deposited on a substrate stack 301, the tantalum overlayer is forced to grow in the alpha-phase because of lattice matching across the tantalum/substantially pure aluminum (Ta/Al) interface.

Table 5, below, shows parameters taken from five study wafers 12–16 with substantially pure aluminum buffer layers and compressive alpha-tantalum overlayers in accordance with of embodiments of the present invention. Each of the study wafers 12–16 included a bulk silicon substrate with passivation layers of silicon nitride and silicon carbide. For each wafer, the buffer layer of substantially pure aluminum was first sputter deposited onto the silicon carbide surface followed by sputtering of the compressive alpha-tantalum layer. The substantially pure aluminum layer thickness for the study wafers 12–16 varied from 100 to 800 Å according to embodiments of the present invention. Columns 2–3 of Table 5 show Ta/Al layer thicknesses measured in Å and alpha-tantalum film stress measured in MPa. Columns 4–5 show deposition parameters for the tantalum-layer, i.e., argon flow rate measured in SCCM, argon pressure measured in mTorr, respectively. Column 6 shows plasma power during sputter deposition measured in kW for tantalum and substantially pure aluminum layers, respectively. The substantially pure aluminum buffer layers were grown at an argon pressure of 2.5 mTorr and an argon flow rate of 50 SCCM according to embodiments of the present invention. Of course, one skilled in the art will recognize that the above-stated plasma power ranges, argon pressure and flow rate for these particular embodiments are merely exemplary and that other ranges and settings for these parameters are also within the scope of the present invention.

TABLE 5

| Wafer No. | Ta/Al Layer Thicknesses (in units of Å) | Alpha-Tantalum Film Stress (in units of MPa) | Argon Flow Rate (in units of SCCM) | Argon Pressure (in units of mTorr) | Plasma Power (in units of kW) |
|---|---|---|---|---|---|
| 12 | 3000/100 | −1022.4 | 50 | 5 | 5 (Ta)/5 (Al) |
| 13 | 3000/200 | −1020.2 | 50 | 5 | 5 (Ta)/5 (Al) |
| 14 | 3000/400 | −1005.5 | 50 | 5 | 5 (Ta)/5 (Al) |
| 15 | 3000/600 | −906.5 | 50 | 5 | 5 (Ta)/5 (Al) |
| 16 | 3000/800 | −908.0 | 50 | 5 | 5 (Ta)/5 (Al) |

Another aspect of embodiments of the present invention including substantially pure aluminum buffer layers is the internal or residual stresses in the resultant alpha-tantalum thin film. The stress data (column 3) shown in Table 5 indicates that the alpha-tantalum films were grown under compressive stress. The compressive stress in the alpha-tantalum grown on the substantially pure aluminum buffer layers can be attributed to the substantially pure aluminum buffer layer. Because of lattice matching across the tantalum/substantially pure aluminum interface, the alpha-tantalum overlayer is forced to grow in compressive stress. Additionally, the alpha-tantalum film stresses show a dependence on the thickness of the substantially pure aluminum buffer layer. No voltage biasing was applied to the substrate during deposition. Applying a substrate voltage bias causes the alpha-tantalum thin films to be even more compressive according to other embodiments of the present invention. The tantalum and substantially pure aluminum layers were deposited using DC magnetron sputtering according to embodiments of the present invention. However, other physical vapor deposition techniques may be used consistent with other embodiments of the present invention.

The strength of adhesion of the Ta/Al bilayer to the silicon carbide passivation layer was tested using a Scotch™ tape method. The Scotch™ tape was used to attempt to peel off the Ta/Al bilayer from the silicon carbide passivation layer. The Ta/Al bilayer failed to peel off. In one embodiment, the adhesion strength can be attributed to metallic bondings between tantalum and its aluminum buffer layer and bond formations across the SiC/Al interface, ensuring robustness of the adhesion between these layers.

Figure 6:
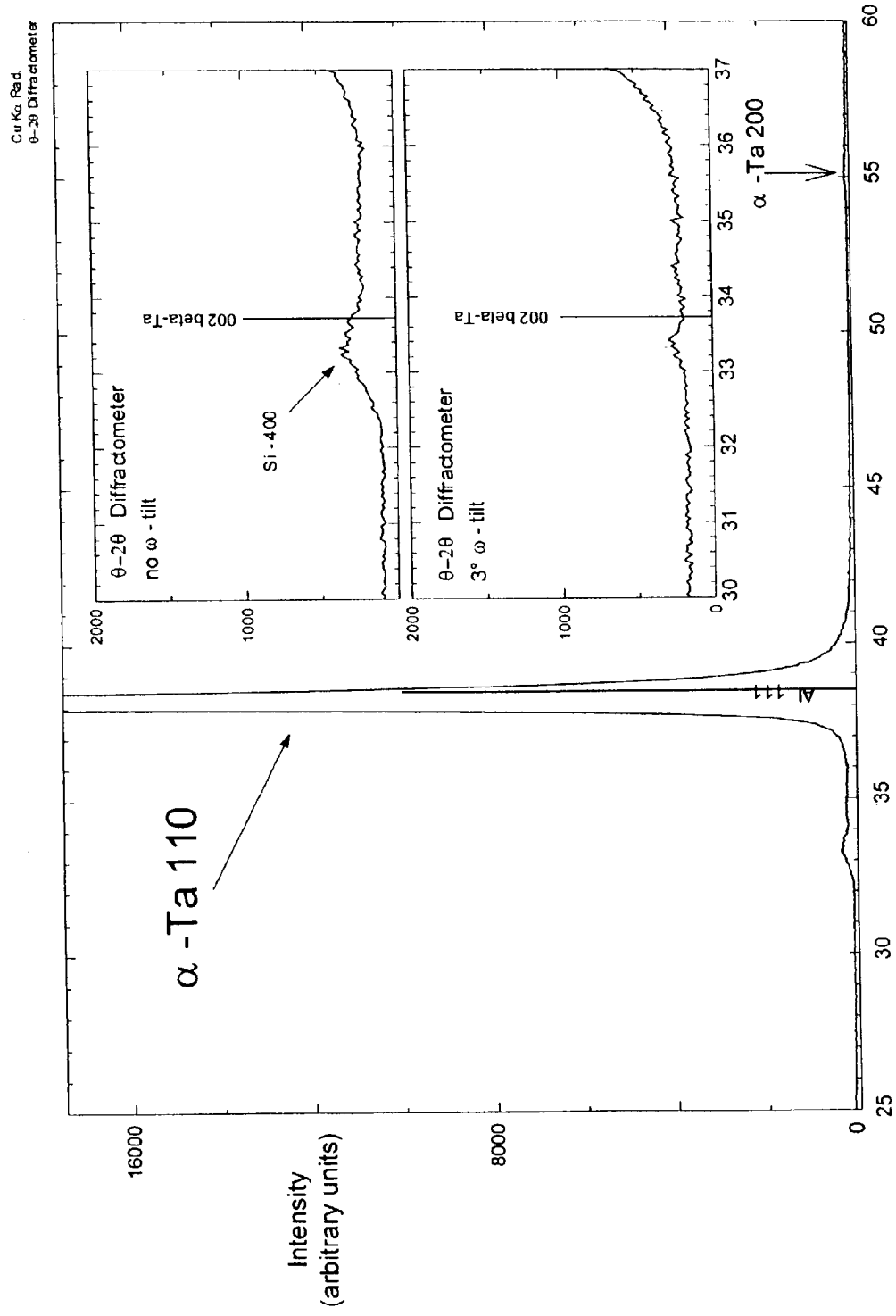
FIG. 6 is a graph of X-ray diffraction data corresponding to a compressive alpha-tantalum film with a substantially pure aluminum buffer layer grown according to an embodiment of the present invention.

FIG. 6 is a graph of X-ray diffraction data corresponding to a compressive alpha-tantalum film with a substantially pure aluminum buffer layer grown on study wafer number 14 according to the method 100 of the embodiments of the present invention. In FIG. 6, the x-axis is diffraction angle measured in angular degrees and the y-axis is intensity measured in arbitrary units. The compressive alpha-tantalum layer was deposited on a 400 Å thick layer of substantially pure aluminum. The peak corresponds to [110] oriented alpha-tantalum. The inset graphs show vertical lines drawn to indicate the expected peak position for beta-Ta(002) reflections. Additionally, the main graph shows an arrow indicating the expected peak position for an alpha-Ta(200) reflection. Both of these expected reflections are absent or small, indicating a well-oriented alpha-Ta(110) layer grown on study wafer number 18. The expected Al(111) reflection is masked because the peaks for alpha-Ta(110) and its Al(111) buffer layer overlap.

Table 6, below, shows X-ray diffraction data for the study wafers 12–16 of Table 1. Columns 2–6 show tantalum/substantially pure aluminum layer thicknesses in units of Å, tantalum phase, alpha-tantalum lattice spacing in units of Å, tantalum grain size in units of A and alpha-tantalum rocking curve as measured in angular degrees at FWHM. The tantalum grain size and rocking curve data shown in Table 6 indicates that the 800 Å thick substantially pure aluminum buffer layer provides narrower grain orientation distribution with smaller internal stress relative to the other study wafers, see Table 5.

TABLE 6

| Wafer No. | Ta/Al Layer Thicknesses (in units of Å) | Tantalum Phase | Alpha-Tantalum Lattice Spacing in units of Å | Tantalum Grain Size (in units of Å) | Alpha-Tantalum Rocking Curve (in units of° FWHM) |
|---|---|---|---|---|---|
| 12 | 3000/100 | alpha | 3.329 ± 0.001 | ~115 | 20 ± 1 |
| 13 | 3000/200 | alpha | 3.330 ± 0.001 | ~110 | 16 ± 1 |
| 14 | 3000/400 | alpha | 3.330 ± 0.001 | ~105 | 13 ± 1 |
| 15 | 3000/600 | alpha | 3.331 ± 0.001 | ~105 | 12 ± 0.5 |
| 16 | 3000/800 | alpha | 3.330 ± 0.001 | ~100 | 9.5 ± 0.5 |

EXAMPLE 4

Aluminum-Copper Alloy Buffer Layer

In this embodiment, the buffer layer 312 may be formed of a layer of an aluminum-copper alloy. The layer of aluminum-copper alloy may include up to about 10% by weight of copper and the balance substantially pure aluminum. Al—Cu alloys are frequently used in the integrated circuit (IC) industry rather than substantially pure aluminum because Al—Cu is less susceptible to electromigration induced failures. Additionally, substantially pure aluminum targets used for sputtering are more expensive and less readily available than Al—Cu targets. As noted above, the crystal structure of aluminum is face centered cubic (fcc) and lattice matches on the Al(111) plane with the Ta(110) plane. Because of this property, if a thin layer of aluminum-copper alloy is first deposited on a substrate stack 301, the tantalum overlayer is forced to grow in the alpha-phase because of lattice matching across the tantalum/aluminum-copper alloy interface. Furthermore, the crystal structure of copper is fcc and copper impurity atoms in aluminum lattice would occupy and substitute for Al atoms at fcc sites.

Table 7, below, shows parameters taken from six study wafers 17–22 with aluminum-copper alloy buffer layers and compressive alpha-tantalum overlayers in accordance with method 100 of the embodiments of the present invention. The Al—Cu alloy targets used for study wafers 17–22 each had up to about 5% by weight of copper with the balance substantially pure aluminum. Each wafer included a bulk silicon substrate with passivation layers of silicon nitride and silicon carbide. For each wafer, the buffer layer of aluminum-copper alloy was first sputter deposited onto the silicon carbide surface followed by sputtering of the compressive alpha-tantalum layer. The aluminum-copper alloy layer thicknesses for the study wafers 17–22 varied from 100 to 800 Å according to embodiments of the present invention. Columns 2–3 of Table 7 show Ta/Al—Cu layer thicknesses measured in Å and alpha-tantalum film stress measured in MPa. Columns 4–5 show deposition parameters for the tantalum layer, i.e., argon flow rate measured in SCCM, argon pressure measured in mTorr, respectively. Column 6 shows plasma power during sputter deposition measured in kW for tantalum and aluminum-copper alloy layers, respectively. The aluminum-copper alloy buffer layers were grown at an argon pressure of 5 mTorr and an argon flow rate of 100 SCCM according to embodiments of the present invention. Of course, one skilled in the art will recognize that the above-stated plasma power ranges, argon pressure and flow rate for these particular embodiments are merely exemplary and that other ranges and settings for these parameters are also within the scope of the present invention.

TABLE 7

| Wafer No. | Ta/Al—Cu Layer Thicknesses (in units of Å) | Alpha-Tantalum Film Stress (in units of MPa) | Argon Flow Rate (in units of SCCM) | Argon Pressure (in units of mTorr) | Plasma Power (in units of kW) |
|---|---|---|---|---|---|
| 17 | 3000/100 | −450.1 | 100 | 5 | 10 (Ta)/1 (Al—Cu) |
| 18 | 3000/200 | −614.2 | 100 | 5 | 10 (Ta)/1 (Al—Cu) |
| 19 | 3000/300 | −666.5 | 100 | 5 | 10 (Ta)/1 (Al—Cu) |
| 20 | 3000/400 | −615.6 | 100 | 5 | 10 (Ta)/1 (Al—Cu) |
| 21 | 3000/600 | −556.8 | 100 | 5 | 10 (Ta)/1 (Al—Cu) |
| 22 | 3000/800 | −507.6 | 100 | 5 | 10 (Ta)/1 (Al—Cu) |

Another aspect of embodiments of the present invention including aluminum-copper alloy buffer layers is the internal or residual stresses in the resultant alpha-tantalum thin film. The stress data (column 3) shown in Table 7 indicates that the alpha-tantalum films were grown under compressive stress. The compressive stress in the alpha-tantalum grown on the aluminum-copper alloy buffer layers can be attributed to the aluminum-copper alloy buffer layer. Because of lattice matching across the tantalum/aluminum-copper alloy interface, the alpha-tantalum overlayer is forced to grow in compressive stress. No voltage biasing was applied to the substrate during deposition. Applying a substrate voltage bias causes the alpha-tantalum thin films to be even more compressive according to other embodiments of the present invention. The tantalum and aluminum-copper alloy layers were deposited using DC magnetron sputtering according to embodiments of the present invention. However, other physical vapor deposition techniques may be used consistent with other embodiments of the present invention.

The strength of adhesion of the Ta/Al—Cu bilayer to the silicon carbide passivation layer was tested using a Scotch™ tape method. The Scotch™ tape was used to attempt to peel off the Ta/Al—Cu bilayer from the silicon carbide passivation layer. The Ta/Al—Cu bilayer failed to peel off. In one embodiment, the adhesion strength can be attributed to metallic bonds between tantalum and its aluminum buffer layer and across the SiC/Al—Cu interface, ensuring robustness of the adhesion between these layers.

Figure 7:
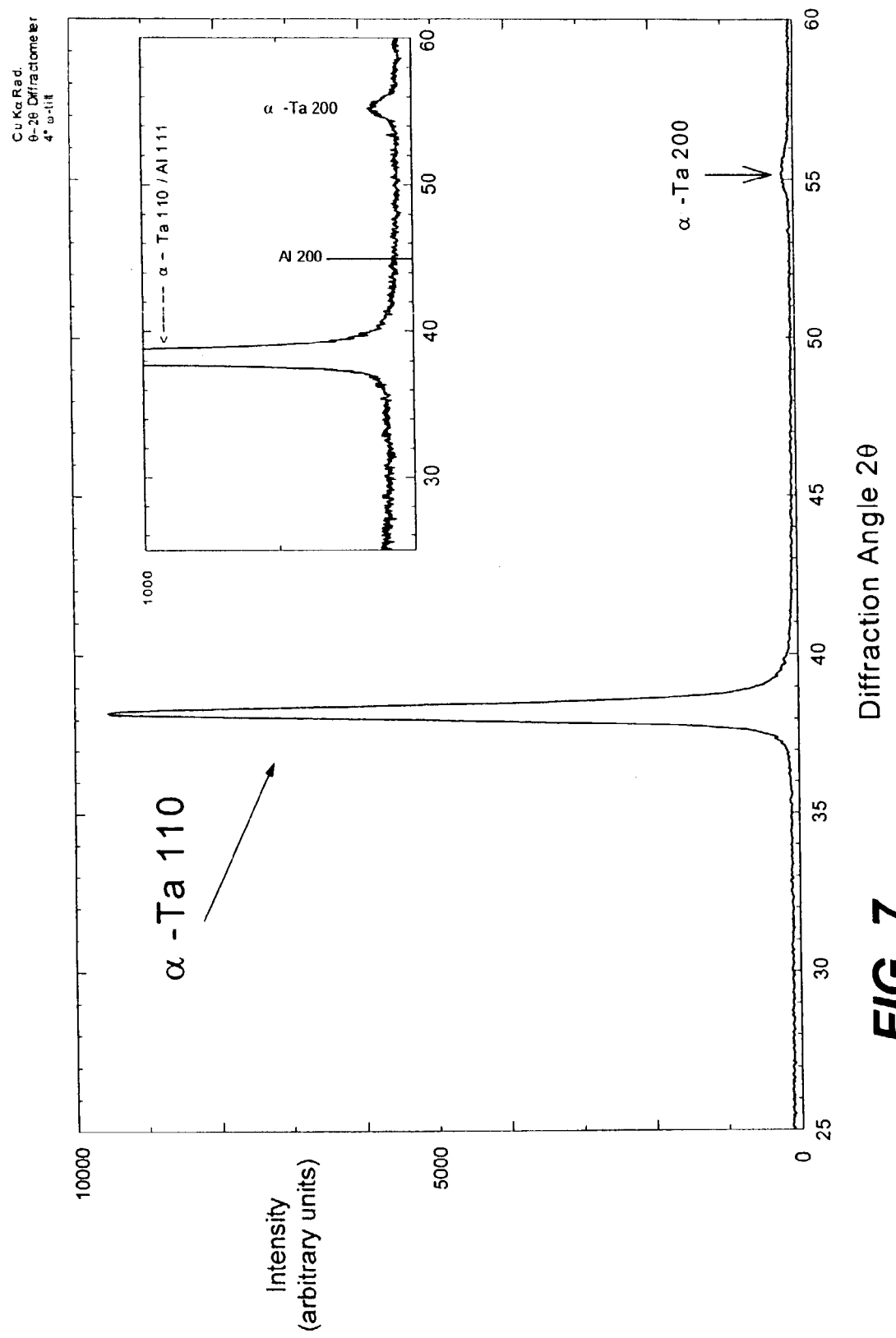
FIG. 7 is a graph of X-ray diffraction data corresponding to a compressive alpha-tantalum film with an aluminum-copper alloy buffer layer grown according to an embodiment of the present invention.

FIG. 7 is a graph of X-ray diffraction data corresponding to a compressive alpha-tantalum film with aluminum-copper alloy buffer layer grown on study wafer number 18 according to method 100 of the embodiments of the present invention. In FIG. 7, the x-axis is diffraction angle measured in angular degrees and the y-axis is intensity measured in arbitrary units. The compressive alpha-tantalum layer was deposited on a 200 Å thick layer of aluminum-copper alloy. The peak in the main graph corresponds to [110] oriented alpha-tantalum. The inset graph shows a vertical line drawn to indicate the expected peak position for Al(200) reflections. Additionally, the main graph shows an arrow indicating the expected peak position for an alpha-Ta(200) reflection. Both of these expected reflections are absent or small, indicating a well-oriented alpha-Ta(110) layer grown on study wafer number 18. The expected Al(111) reflection is masked because the peaks for alpha-Ta(110) and its Al(111) buffer layer overlap.

Table 8, below, shows X-ray diffraction data for the study wafers 17–22 of Table 7. Columns 2–6 show tantalum/aluminum-copper alloy layer thicknesses in units of Å, tantalum phase, alpha-tantalum lattice spacing in units of Å, tantalum grain size in units of A and alpha-tantalum rocking curve as measured in degrees FWHM. As shown in Table 8, the tantalum thin films on wafers 17–22 exhibit diffusely or broadly distributed grains.

TABLE 8

| Wafer No. | Ta/Al—Cu Layer Thicknesses (in units of Å) | Tantalum Phase | Alpha-Tantalum Lattice Spacing in units of Å | Tantalum Grain Size (in units of Å) | Alpha-Tantalum Rocking Curve (in units of° FWHM) |
|---|---|---|---|---|---|
| 17 | 3000/100 | alpha & beta | 3.321 ± 0.001 | ~105 | ∞ |
| 18 | 3000/200 | alpha | 3.324 ± 0.001 | ~110 | ∞ |
| 19 | 3000/300 | alpha | 3.324 ± 0.001 | ~115 | ∞ |
| 20 | 3000/400 | alpha | 3.323 ± 0.001 | ~115 | ∞ |
| 21 | 3000/600 | alpha | 3.323 ± 0.001 | ~110 | ∞ |
| 22 | 3000/800 | alpha | 3.323 ± 0.001 | ~110 | ∞ |

It is to be understood that the above-referenced arrangements and examples are illustrative of the applications for the principles of embodiments of the present invention. Numerous modifications and alternative arrangements may be devised without departing from the spirit and scope of embodiments of the present invention. While embodiments of the present invention have been shown in the drawings and described above in connection with the exemplary embodiments of the invention, it will be apparent to those of ordinary skill in the art that numerous modifications may be implemented without departing from the principles and concepts of the invention as set forth in the claims.

What is claimed is:

1. A method of forming a layer of compressive alpha-tantalum on a substrate, comprising:
    applying a voltage bias to the substrate while depositing a buffer layer on the substrate; and
    depositing the layer of compressive alpha-tantalum on the buffer layer with lattice matching between the layer of compressive alpha-tantalum and the buffer layer.

2. The method according to claim 1, wherein depositing comprises at least one of the following: sputtering, laser ablation, e-beam and thermal evaporation.

3. The method according to claim 1, wherein applying a voltage bias comprises applying a voltage ranging from about 0 volts to about −500 volts.

4. The method according to claim 1, wherein depositing a layer of compressive alpha-tantalum comprises sputtering a layer of compressive alpha-tantalum having thickness from about 10 Angstroms to about 4 micrometers.

5. The method according to claim 1, wherein the substrate comprises silicon carbide.

6. The method according to claim 1, wherein the substrate comprises silicon nitride.

7. The method according to claim 1, wherein depositing a buffer layer comprises depositing a layer of titanium.

8. The method according to claim 7, wherein depositing a layer of titanium further comprises depositing a layer of titanium having thickness from about 3 monolayers to about 2000 Angstroms.

9. The method according to claim 7, wherein depositing a layer of titanium further comprises depositing a layer of titanium having thickness from at least about 400 Angstroms.

10. The method according to claim 7, wherein the layer of titanium orients on the substrate with titanium crystal [100] direction perpendicular to the substrate.

11. The method according to claim 7, wherein the layer of titanium comprises textured titanium grains.

12. The method according to claim 7, wherein the lattice matching occurs between the layer of titanium and the layer of compressive alpha-tantalum.

13. The method according to claim 1, wherein depositing a buffer layer comprises depositing a layer of niobium.

14. The method according to claim 13, wherein depositing a layer of niobium further comprises depositing a layer of niobium having thickness from about 3 monolayers to about 2000 Angstroms.

15. The method according to claim 7, wherein depositing a layer of niobium further comprises depositing a layer of niobium having thickness from at least about 200 Angstroms.

16. The method according to claim 1, wherein depositing a buffer layer comprises depositing a layer of substantially pure aluminum.

17. The method according to claim 16, wherein depositing a layer of substantially pure aluminum further comprises depositing a layer of substantially pure aluminum having thickness from about 3 monolayers to about 2000 Angstroms.

18. The method according to claim 1, wherein depositing a buffer layer comprises depositing a layer of aluminum-copper alloy.

19. The method according to claim 18, wherein depositing a layer of aluminum-copper alloy comprises depositing a layer of aluminum-copper alloy comprising up to about 10% by weight of copper.

20. The method according to claim 19, wherein depositing a layer of aluminum-copper alloy further comprises depositing a layer of aluminum-copper alloy having thickness from about 3 monolayers to about 2000 Angstroms.

21. The method according to claim 1, wherein depositing the buffer layer on the substrate and depositing the layer of compressive alpha-tantalum on the buffer layer further comprises maintaining substrate temperatures less than 300° C.

* * * * *

UNITED STATES PATENT AND TRADEMARK OFFICE
CERTIFICATE OF CORRECTION

PATENT NO.        : 6,955,835 B2                                              Page 1 of 1
APPLICATION NO.   : 10/426564
DATED             : October 18, 2005
INVENTOR(S)       : Arjang Fartash It is certified that error appears in the above-identified patent and that said Letters Patent is hereby corrected as shown below:

On the Title Pg Item (54) in "Title", & column 1, line 1, delete "FOR" and insert -- OF --, therefor.

On the Title Pg Item (54) in "Title", & column 1, line 3, after "INCLUDING" delete "THE".

In column 1, line 1, delete "FOR" and insert -- OF --, therefor.

In column 1, line 3, after "INCLUDING" delete "THE".

Signed and Sealed this

Fourteenth Day of July, 2009

JOHN DOLL
*Acting Director of the United States Patent and Trademark Office*